United States Patent
Yang et al.

(10) Patent No.: US 12,232,310 B2
(45) Date of Patent: Feb. 18, 2025

(54) METHOD OF FORMING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Peng Yang, Hefei (CN); Gongyi Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 463 days.

(21) Appl. No.: 17/647,622

(22) Filed: Jan. 11, 2022

(65) Prior Publication Data

US 2023/0043941 A1 Feb. 9, 2023

Related U.S. Application Data

(63) Continuation of application No. PCT/CN2021/113577, filed on Aug. 19, 2021.

(30) Foreign Application Priority Data

Aug. 9, 2021 (CN) .......................... 202110907578.5

(51) Int. Cl.
| | |
|---|---|
| H10B 12/00 | (2023.01) |
| H01L 21/768 | (2006.01) |
| H01L 23/522 | (2006.01) |

(52) U.S. Cl.
CPC ..... *H10B 12/482* (2023.02); *H01L 21/76897* (2013.01); *H01L 23/5225* (2013.01)

(58) Field of Classification Search
CPC .......... H01L 21/76897; H01L 23/5225; H01L 29/0649; H10B 12/482
(Continued)

(56) References Cited

U.S. PATENT DOCUMENTS

| | | |
|---|---|---|
| 2008/0284029 A1 | 11/2008 | Kim et al. |
| 2015/0262625 A1 | 9/2015 | Han et al. |

(Continued)

FOREIGN PATENT DOCUMENTS

| | | |
|---|---|---|
| CN | 112951761 A | 11/2021 |

OTHER PUBLICATIONS

International Search Report cited in PCT/CN2021/113577; mailed May 9, 2022; 8 pgs.

*Primary Examiner* — Igwe U Anya
(74) *Attorney, Agent, or Firm* — Syncoda LLC; Feng Ma

(57) ABSTRACT

The present disclosure provides a method of forming a semiconductor structure and a semiconductor structure. The method of forming a semiconductor structure includes: providing an initial structure, where the initial structure includes a substrate and bit line structures arranged at intervals on the substrate; forming an initial protective structure, where the initial protective structure at least covers a part of sidewalls of each of the bit line structures, and the initial protective structure has a first height in a direction parallel to the bit line structures; forming a shielding structure, where the shielding structure at least covers a part of sidewalls of the initial protective structure; and removing at least a part of the initial protective structure exposed by the shielding structure by using the shielding structure as an etching selection layer, to form protective structures each having a second height.

14 Claims, 8 Drawing Sheets

(58) Field of Classification Search
USPC .......................................................... 257/487
See application file for complete search history.

(56) References Cited

U.S. PATENT DOCUMENTS

2017/0062347 A1* 3/2017 Kim .................... H01L 29/0649
2019/0157275 A1* 5/2019 Lee ....................... H01L 21/764
2021/0043579 A1   2/2021 Fumagalli et al.

* cited by examiner

METHOD OF FORMING SEMICONDUCTOR STRUCTURE AND SEMICONDUCTOR STRUCTURE

CROSS-REFERENCE TO RELATED APPLICATIONS

This is a continuation of International Patent Application No. PCT/CN2021/113577, filed on Aug. 19, 2021, which claims the priority to Chinese Patent Application No. 202110907578.5, titled "METHOD OF FORMING SEMICONDUCTOR STRUCTURE AND SEMICONDUCTOR STRUCTURE" and filed on Aug. 9, 2021. The entire contents of International Patent Application No. PCT/CN2021/113577 and Chinese Patent Application No. 202110907578.5 are incorporated herein by reference.

TECHNICAL FIELD

The present disclosure relates to, but is not limited to, a method of forming a semiconductor structure and a semiconductor structure.

BACKGROUND

As the integration of the dynamic random access memory (DRAM) increases, the DRAM manufacture process is required to have higher control accuracy.

At present, the height of the isolation structure covering sidewalls of the bit line structure cannot be precisely controlled in the DRAM manufacture process, and the etching of the isolation structure may damage the sidewalls of the bit line structure, which causes a great risk to the subsequent manufacture process and seriously affects the yield and reliability of the product.

SUMMARY

An overview of the subject matter detailed in the present disclosure is provided below, which is not intended to limit the protection scope of the claims.

The present disclosure provides a method of forming a semiconductor structure and a semiconductor structure.

According to a first aspect, the present disclosure provides a method of forming a semiconductor structure. The method of forming a semiconductor structure includes:

providing an initial structure, where the initial structure includes a substrate and bit line structures arranged at intervals on the substrate;

forming an initial protective structure, where the initial protective structure at least covers a part of sidewalls of each of the bit line structures, and the initial protective structure has a first height in a direction parallel to the bit line structures;

forming a shielding structure, where the shielding structure at least covers a part of sidewalls of the initial protective structure; and removing at least a part of the initial protective structure exposed by the shielding structure by using the shielding structure as an etching selection layer, to form protective structures each having a second height.

According to a second aspect, the present disclosure provides a semiconductor structure. The semiconductor structure includes: an initial structure, where the initial structure includes a substrate and bit line structures arranged at intervals on the substrate; and protective structures, wherein each of the protective structures covers a part of sidewalls of each of the bit line structures, and the protective structures each have a second height in a direction parallel to the bit line structures.

Other aspects of the present disclosure are understandable upon reading and understanding of the drawings and detailed description.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings based on these drawings without creative efforts.

DETAILED DESCRIPTION

The following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that without conflict, the embodiments in the present disclosure and features in the embodiments may be combined with each other.

In the existing method of forming a semiconductor structure, a method for forming protective structures on sidewalls of the bit line structures is as follows:
   providing an initial structure, where the initial structure includes a substrate and bit line structures arranged at intervals on the substrate;
   forming an initial protective structure, where the initial protective structure covers the bit line structures and the exposed substrate; and
   etching to remove a part of the initial protective structure to expose the substrate.

However, in the related art, the accuracy of etching to remove a part of the initial protective structure is difficult to control, which may cause damage to the sidewalls of the bit line structures, resulting in a great risk to the subsequent manufacture process and seriously affecting the yield and reliability of the product.

Figure 1:
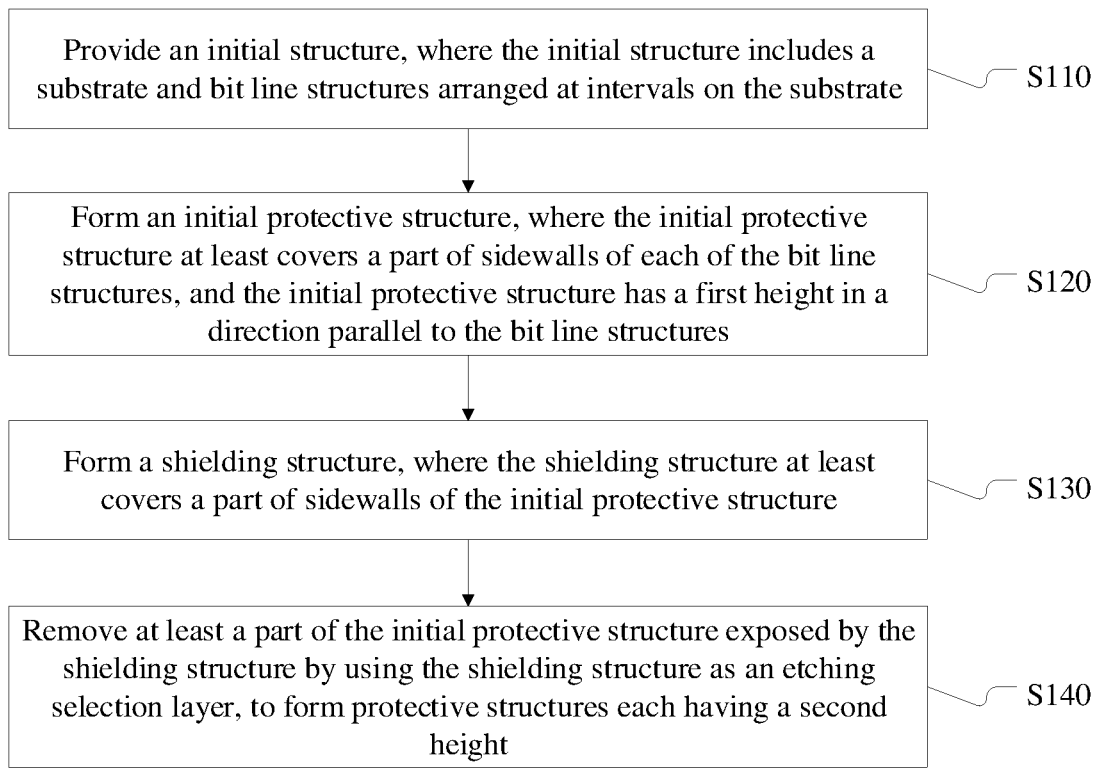
FIG. 1 is a flowchart of a method of forming a semiconductor structure according to an exemplary embodiment.
Figure 2:
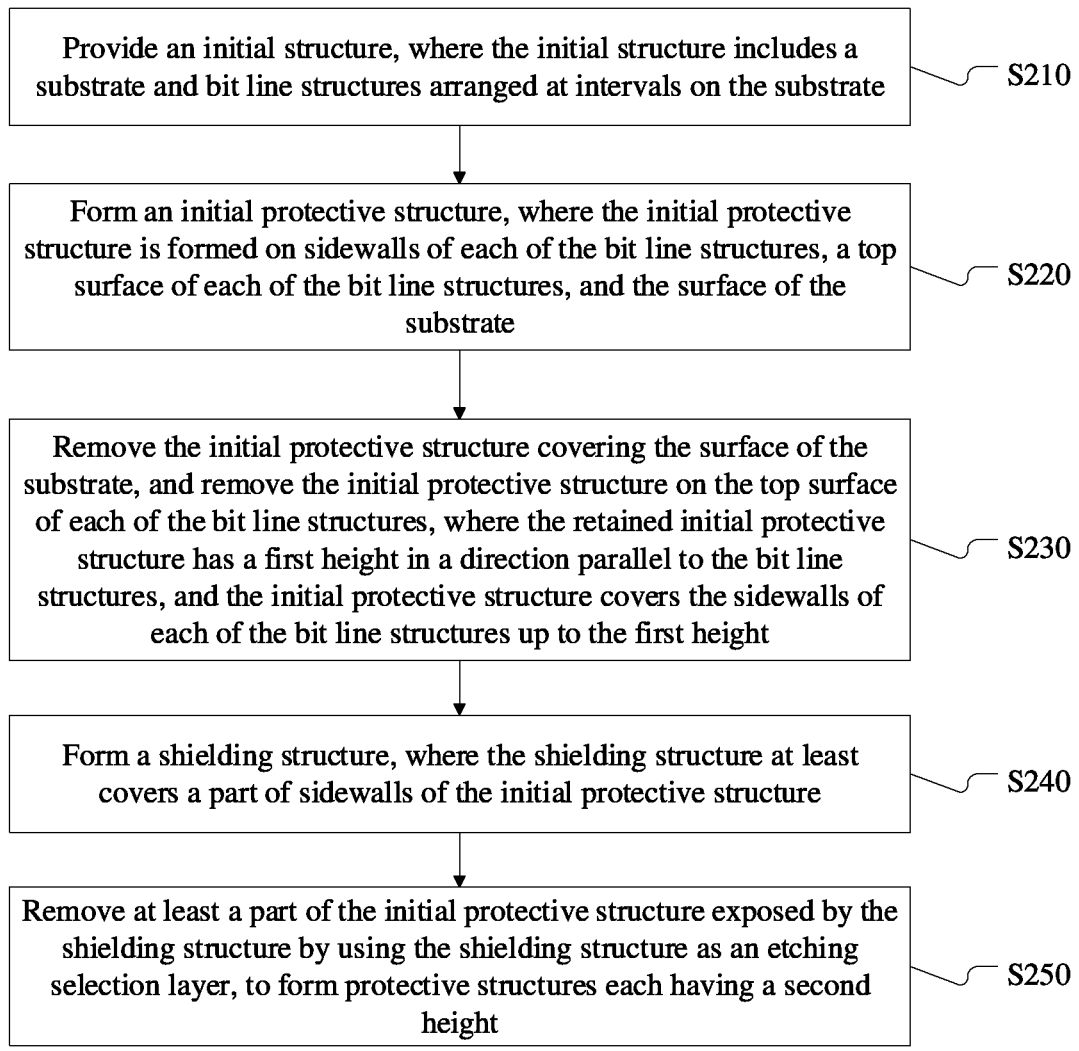
FIG. 2 is a flowchart of a method of forming a semiconductor structure according to an exemplary embodiment.
Figure 3:
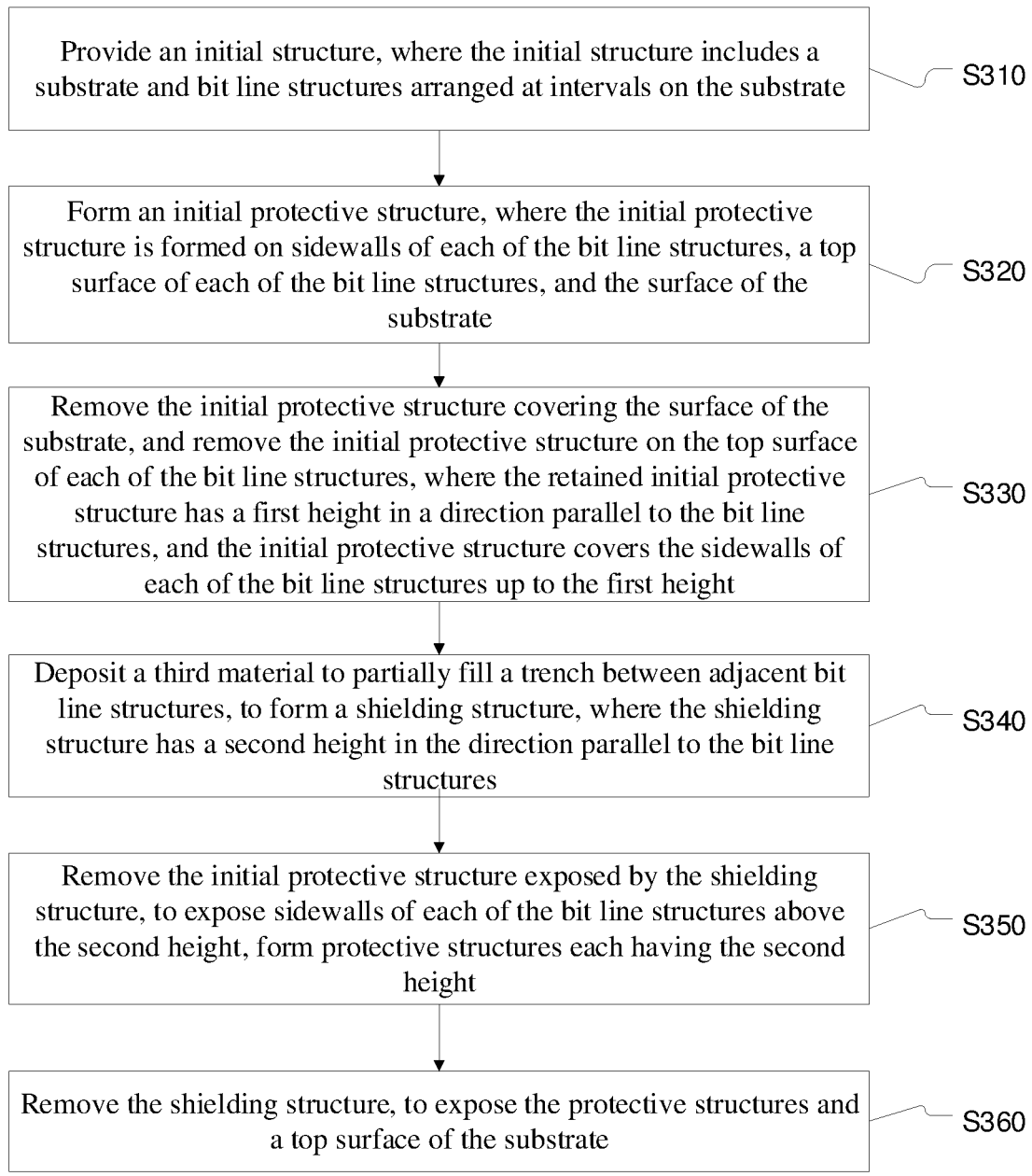
FIG. 3 is a flowchart of a method of forming a semiconductor structure according to an exemplary embodiment.
Figure 4:
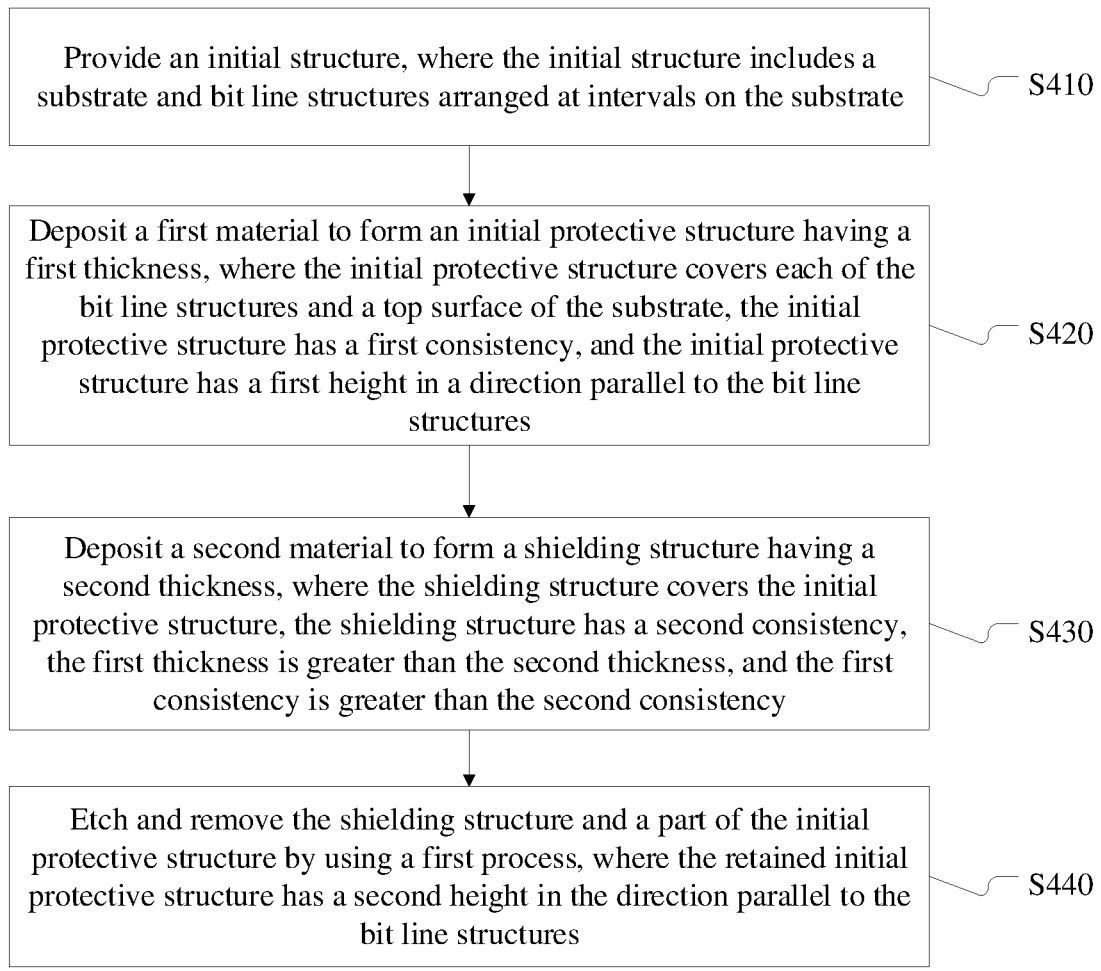
FIG. 4 is a flowchart of providing an initial structure in a method of forming a semiconductor structure according to an exemplary embodiment.
Figure 5:
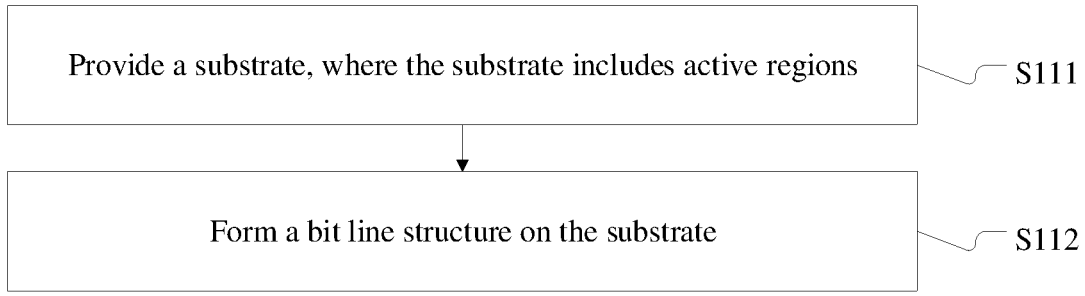
FIG. 5 is a flowchart of a method of forming a semiconductor structure according to an exemplary embodiment.
Figure 6:
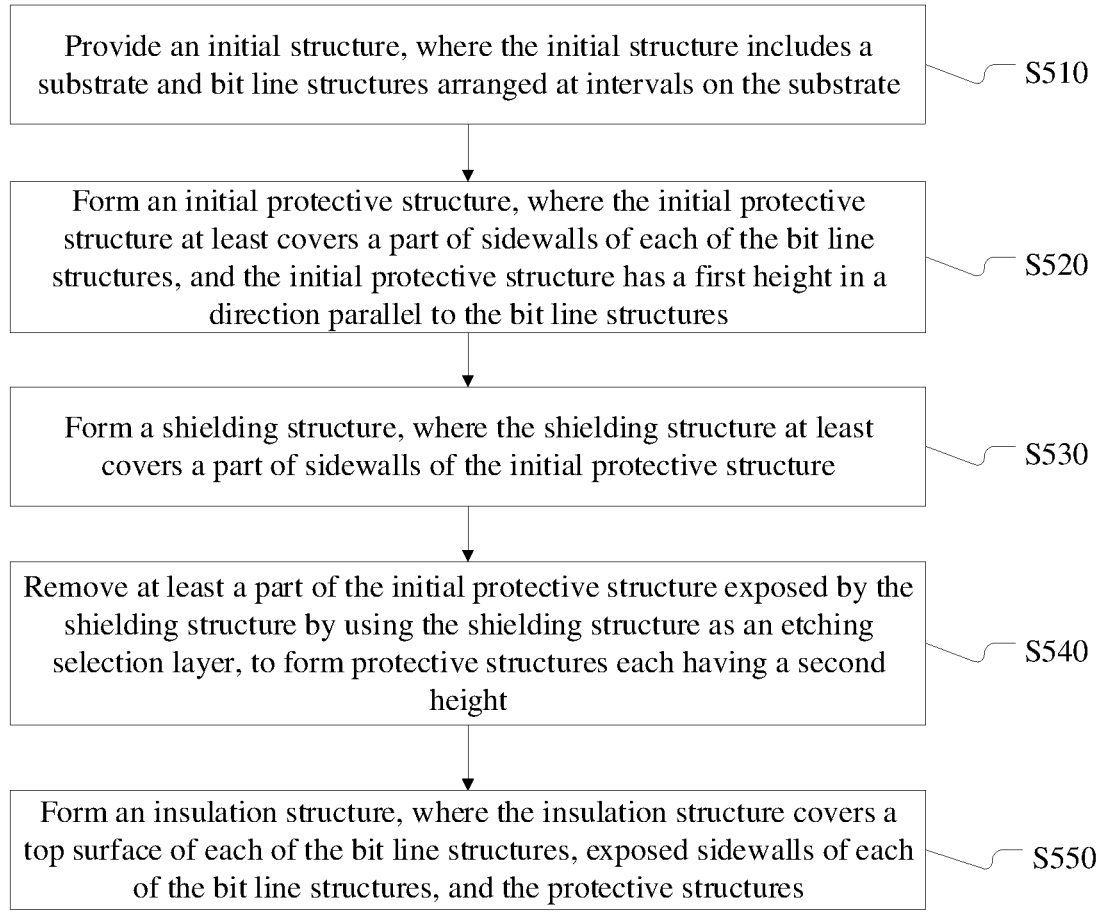
FIG. 6 is a flowchart of a method of forming a semiconductor structure according to an exemplary embodiment.

An exemplary embodiment of the present disclosure provides a method of forming a semiconductor structure, as shown in FIG. 1. FIG. 1 is a flowchart of a method of forming a semiconductor structure according to an exemplary embodiment of the present disclosure. FIG. 7 to FIG. 18 are schematic diagrams of various stages of the method of forming a semiconductor structure. The method of forming a semiconductor structure is described below with reference to FIG. 7 to FIG. 18.

The semiconductor structure is not limited in this embodiment. The semiconductor structure is described below by taking a dynamic random access memory (DRAM) as an example, but this embodiment is not limited to this, and the semiconductor structure in this embodiment may also be other structures.

As shown in FIG. 1, an exemplary embodiment of the present disclosure provides a method of forming a semiconductor structure. The method of forming a semiconductor structure includes the following steps:
   Step S110: Provide an initial structure, where the initial structure includes a substrate and bit line structures arranged at intervals on the substrate.

Figure 7:
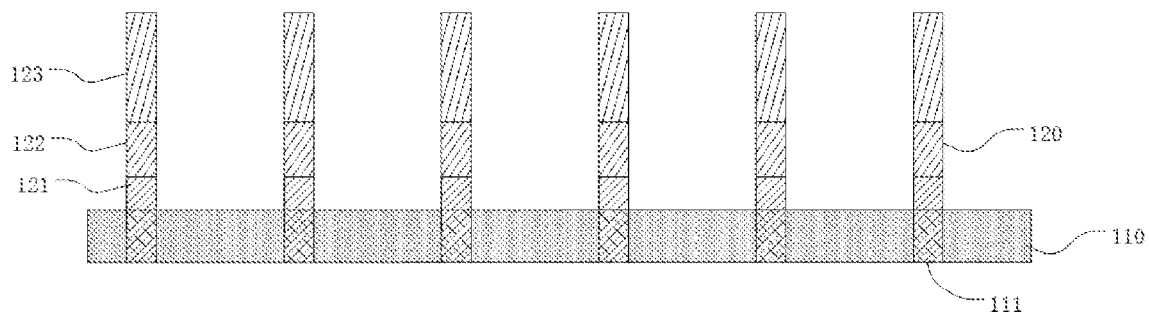
FIG. 7 is a schematic diagram of an initial structure provided in a method of forming a semiconductor structure according to an exemplary embodiment.

As shown in FIG. 7, the initial structure 100 includes a substrate 110 and bit line structures 120 arranged on the substrate 110. The bit line structures 120 are arranged at intervals and parallel to each other. A part of a top surface of the substrate 110 is exposed, and sidewalls of each of the bit line structures 120 and the exposed top surface of the substrate 110 form a trench.

The substrate 110 is a semiconductor substrate including a silicon-containing substance. For example, the semiconductor substrate may be a silicon substrate, a silicon-germanium substrate, or a silicon on insulator (SOI) substrate.

Step S120: Form an initial protective structure, where the initial protective structure at least covers a part of sidewalls of each of the bit line structures, and the initial protective structure has a first height in a direction parallel to the bit line structures.

Figure 8:
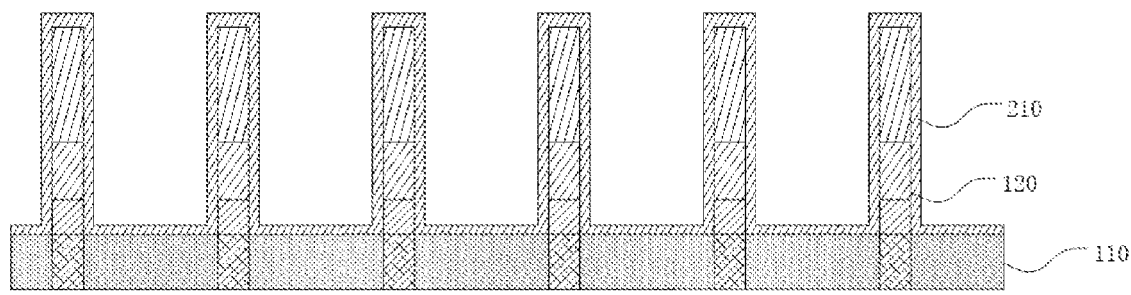
FIG. 8 is a schematic diagram of forming an initial protective structure in a method of forming a semiconductor structure according to an exemplary embodiment.
Figure 9:
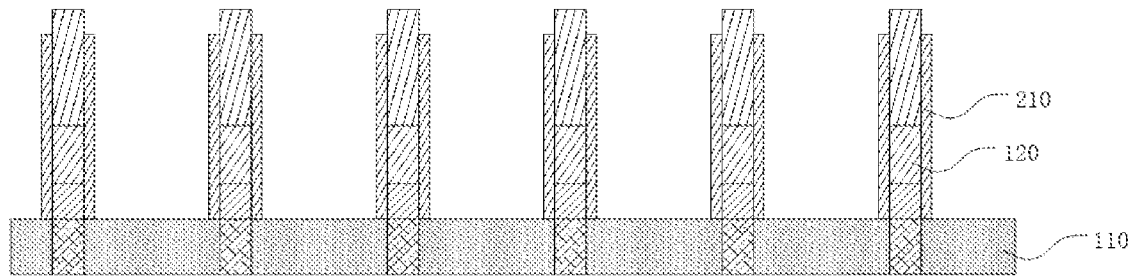
FIG. 9 is a schematic diagram of removing a part of an initial protective structure in a method of forming a semiconductor structure according to an exemplary embodiment.

As shown in FIG. 8 and FIG. 9, the initial protective structure 210 can be formed through atomic layer deposition (ALD). For example, a material of the initial protective structure 210 may include silicon oxide ($SiO_2$), silicon nitride (SiN) or silicon oxynitride (SiON).

In the direction parallel to the bit line structures 120, the initial protective structure 210 has the first height, where the first height may be equal to the height of the bit line structures 120 or less than the height of the bit line structures 120.

Step S130: Form a shielding structure, where the shielding structure at least covers a part of sidewalls of the initial protective structure.

Figure 10:
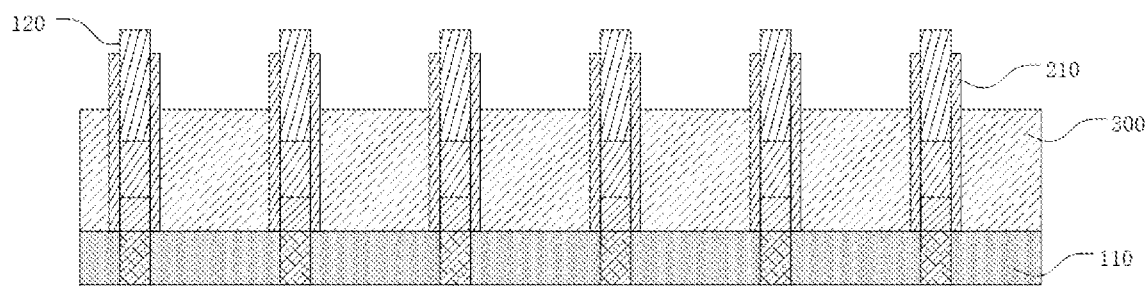
FIG. 10 is a schematic diagram of forming a shielding structure in a method of forming a semiconductor structure according to an exemplary embodiment.
Figure 14:
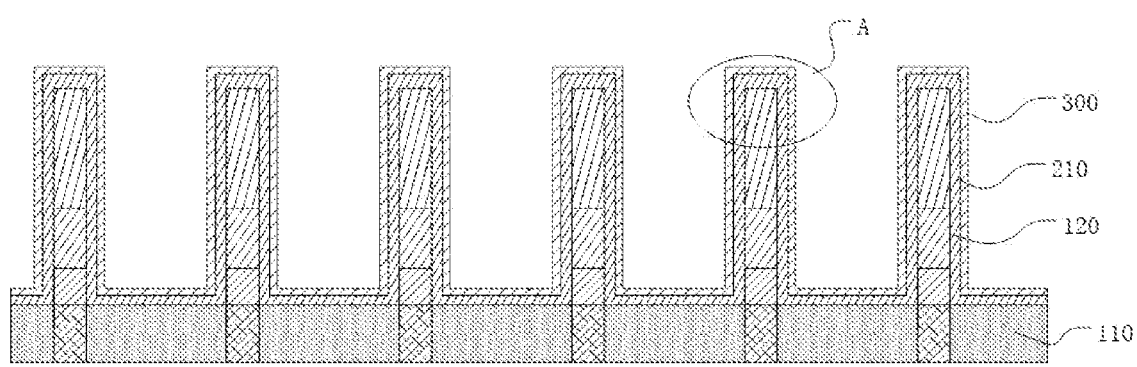
FIG. 14 is a schematic diagram of forming a shielding structure in a method of forming a semiconductor structure according to an exemplary embodiment.
Figure 15:
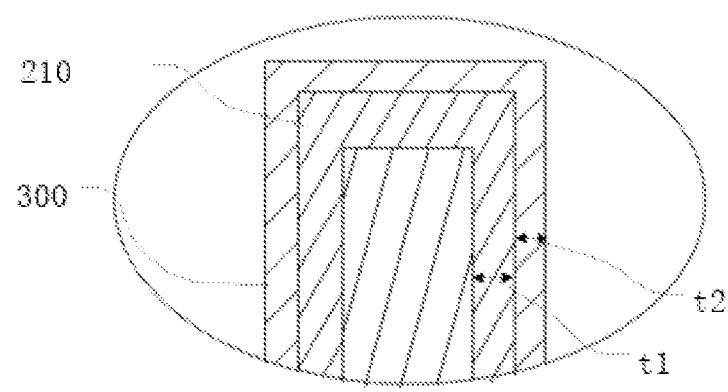
FIG. 15 is an enlarged view of a position A in FIG. 14.

As shown in FIG. 10 and FIG. 14, the shielding structure 300 covers all or a part of the sidewalls of the initial protective structure 210.

Step S140: Remove at least a part of the initial protective structure exposed by the shielding structure by using the shielding structure as an etching selection layer, to form protective structures each having a second height.

Figure 12:
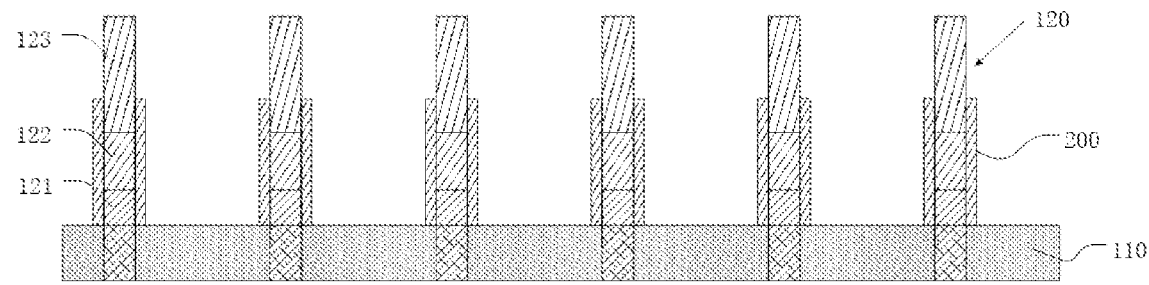
FIG. 12 is a schematic diagram of removing a shielding structure in a method of forming a semiconductor structure according to an exemplary embodiment.

As shown in FIG. 12, the shielding structure 300 and the initial protective structure 210 may be etched by selecting an etching selectivity of the shielding structure 300 and an etching selectivity of the initial protective structure 210, to remove a part of the initial protective structure 210. The retained initial protective structure 210 forms the protective structures 200, and the protective structures 200 each have a second height less than the first height. That is, each of the protective structures 200 covers the sidewalls of each of the bit line structures 120 up to the second height.

In this embodiment, by using the shielding structure as the etching selection layer, a part of the initial protective structure is removed by selecting the etching selectivity of the shielding structure and the etching selectivity of the initial protective structure, to form the protective structures that cover the sidewalls the bit line structures up to the second height, which realizes the precise control over the sidewall contour of each of the bit line structures and makes the sidewall contour of each of the bit line structures complete. This provides a basis for the development and mass production of semiconductor structures with higher precision, and ensures the yield and reliability of semiconductor structures with fine precision.

According to an exemplary embodiment, the method of forming a semiconductor structure provided by this embodiment includes the following steps:
   Step S210: Provide an initial structure, where the initial structure includes a substrate and bit line structures arranged at intervals on the substrate.
   Step S220: Form an initial protective structure, where the initial protective structure is formed on sidewalls of each of the bit line structures, a top surface of each of the bit line structures, and a surface of the substrate.
   Step S230: Remove the initial protective structure covering the surface of the substrate, and remove the initial protective structure on the top surface of each of the bit line structures, where the retained initial protective structure has a first height in a direction parallel to the bit line structures, and the initial protective structure covers the sidewalls of each of the bit line structures up to the first height.

Step S240: Form a shielding structure, where the shielding structure at least covers a part of sidewalls of the initial protective structure.

Step S250: Remove at least a part of the initial protective structure exposed by the shielding structure by using the shielding structure as an etching selection layer, to form protective structures each having a second height.

Step S210 in this embodiment is implemented in the same manner as step S110 in the foregoing embodiment, and steps S240 and S250 in this embodiment are implemented in the same manner as steps S130 and S140 of the foregoing embodiment; details will not be described again herein.

In step S220 of this embodiment, as shown in FIG. 8 with reference to FIG. 7, the initial protective structure 210 is formed on the sidewalls of each of the bit line structures 120, the top surface of each of the bit line structures 120, and the surface of the substrate 110. The initial protective structure 210 may be formed through atomic layer deposition (ALD). A material of the initial protective structure 210 may include silicon oxide (SiO$_2$), silicon nitride (SiN) or silicon oxynitride (SiON). The initial protective structure 210 covers the bit line structures 120 and the exposed top surface of the substrate 110.

In step S230 of this embodiment, as shown in FIG. 9 with reference to FIG. 8, the initial protective structure 210 covering the surface of the substrate 110 and the initial protective structure 210 covering the top surface of each of the bit line structures 120 are removed through dry etching. In the etching process, a part of the initial protective structure 210 covering the top of the sidewalls of each of the bit line structures 120 is removed together with the initial protective structure 210 covering the top surface of each of the bit line structures 120. The retained initial protective structure 210 has the first height in the direction parallel to the bit line structures 120, and the initial protective structure 210 covers the sidewalls of each of the bit line structures 120 up to the first height.

In this embodiment, the formed initial protective structure covers the bit line structures and the exposed top surface of the substrate. Then, the top surface of the substrate exposed by the initial protective structure is removed through etching, to facilitate the subsequent manufacture process of the semiconductor structure. While the initial protective structure covering the substrate is removed, the partial initial protective structure covering the top surface of each of the bit line structures and the partial initial protective structure covering the sidewalls of each of the bit line structures are removed at the same time. The retained initial protective structure has the first height in the direction parallel to the bit line structures. The initial protective structure covers the sidewalls of each of the bit line structures up to the first height, and exposes the substrate to facilitate the subsequent manufacture process of the semiconductor structure.

According to an exemplary embodiment, the method of forming a semiconductor structure provided by this embodiment includes the following steps:

Step S310: Provide an initial structure, where the initial structure includes a substrate and bit line structures arranged at intervals on the substrate.

Step S320: Form an initial protective structure, where the initial protective structure is formed on sidewalls of each of the bit line structures, a top surface of each of the bit line structures, and a surface of the substrate.

Step S330: Remove the initial protective structure covering the surface of the substrate, and remove the initial protective structure on the top surface of each of the bit line structures, where the retained initial protective structure has a first height in a direction parallel to the bit line structures, and the initial protective structure covers the sidewalls of each of the bit line structures up to the first height.

As shown in FIG. 9, in step S330, when the initial protective structure 210 covering the surface of the substrate 110 and the initial protective structure 210 covering the top surface of each of the bit line structures 120 are removed, the contour of a part of the sidewalls at the top of the retained initial protective structure 210 may be damaged during etching.

Step S340: Deposit a third material to partially fill a trench between adjacent bit line structures, to form a shielding structure, where the shielding structure has a second height in the direction parallel to the bit line structures.

As shown in FIG. 10, when the shielding structure 300 is formed in this embodiment, the height of the shielding structure 300 is adjusted, such that the initial protective structure 210 covered by the formed shielding structure 300 has a complete contour, and the exposed initial protective structure 210 has a damaged part.

For example, as shown in FIG. 10 with reference to FIG. 9, the third material is filled in a part of the trench between every two adjacent bit line structures 120 through spin coating, to form the shielding structure 300. The shielding structure 300 has the second height. The shielding structure 300 covers the top surface of the substrate 110 and the sidewalls of each of the bit line structures 120 up to the second height, where the second height is lower than the first height.

The third material may be a carbon-containing material. For example, the third material may be spin-on-carbon (SOC) or a photoresist (PR). In this embodiment, the third material is spin-on-carbon (SOC).

Step S350: Remove the initial protective structure exposed by the shielding structure, to expose sidewalls of each of the bit line structures above the second height, thus forming protective structures each having the second height.

Figure 11:
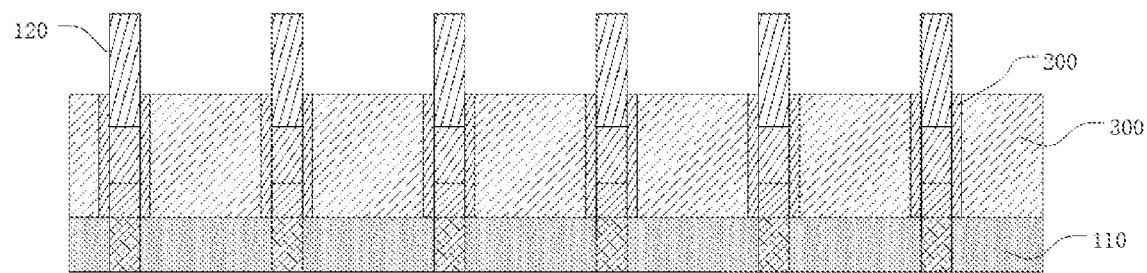
FIG. 11 is a schematic diagram of removing the exposed initial protective structure by using a shielding structure as an etching selection layer in a method of forming a semiconductor structure according to an exemplary embodiment.

In step S350 of this embodiment, as shown in FIG. 11, an etching process having a high etching selectivity for the third material is selected to remove the initial protective structure 210 exposed by the shielding structure 300, and the initial protective structure covered by the shielding structure 300 is used as the protective structures 200. The protective structures 200 each have the second height, and the sidewall contour of each of the protective structures 200 is complete.

In this embodiment, the height of the shielding structure is adjusted to define the height of the initial protective structure to be retained, such that the contour of each of the protective structures is complete and the sidewall contour of each of the bit line structures is defined, thus improving the yield and reliability of the product.

In this exemplary embodiment, after step S350, the method further includes:

Step S360: Remove the shielding structure, to expose the protective structures and a top surface of the substrate.

As shown in FIG. 12 with reference to FIG. 11, the shielding structure 300 is removed from the trench between every two adjacent bit line structures 120, to expose the top surface of the substrate 110 and the protective structures 200, to facilitate the subsequent manufacture process of the semiconductor structure.

According to an exemplary embodiment, the method of forming a semiconductor structure provided by this embodiment includes the following steps:

Step S410: Provide an initial structure, where the initial structure includes a substrate and bit line structures arranged at intervals on the substrate.

Step S420: Deposit a first material to form an initial protective structure having a first thickness, where the initial protective structure covers each of the bit line structures and a top surface of the substrate, the initial protective structure has a first consistency, and the initial protective structure has a first height in a direction parallel to the bit line structures.

As shown in FIG. 8, the first material may be deposited through atomic layer deposition (ALD). The first material covers the bit line structures 120 and the top surface of the substrate 110 to form the initial protective structure 210 having the first thickness t1 (referring to FIG. 15); the temperature and speed for depositing the first material are adjusted, such that the formed initial protective structure 210 has the first consistency. In this embodiment, the initial protective structure 210 covers the bit line structures 120, and the initial protective structure 210 has the first height that is equal to the height of the bit line structures 120.

For example, the first material may be one of or a mixture of two or more of silicon oxide ($SiO_2$), silicon nitride (SiN) or silicon oxynitride (SiON).

Step S430: Deposit a second material to form a shielding structure having a second thickness, where the shielding structure covers the initial protective structure, the shielding structure has a second consistency, the first thickness is greater than the second thickness, and the first consistency is greater than the second consistency.

As shown in FIG. 14 with reference to FIG. 8, the second material may be deposited through atomic layer deposition (ALD). The second material covers the initial protective structure 210 to form the shielding structure 300 having the second thickness t2 (referring to FIG. 15); the temperature and speed for depositing the second material are adjusted, such that the formed shielding structure 300 has the second consistency. In addition, the first thickness t1 is greater than the second thickness t2 (referring to FIG. 15), and the first consistency is greater than second consistency.

For example, the second material may be one of or a mixture of two or more of silicon oxide ($SiO_2$), silicon nitride (SiN) or silicon oxynitride (SiON). The second material may be the same as or different from the first material.

Step S440: Etch and remove the shielding structure and a part of the initial protective structure by using a first process, where the retained initial protective structure has a second height in the direction parallel to the bit line structures.

In step S440 of this embodiment, the shielding structure 300 and a part of the initial protective structure 210 are etched and removed by using the first process. In the first process, the etching selectivity of the second material is greater than the etching selectivity of the first material. The first process is anisotropic etching, an extension direction of the bit line structures 120 is taken as a vertical direction, an arrangement direction of the substrate 110 is taken as a horizontal direction, and the etching speed of the first process in the vertical direction is greater than the etching speed of the first process in the horizontal direction.

Figure 16:
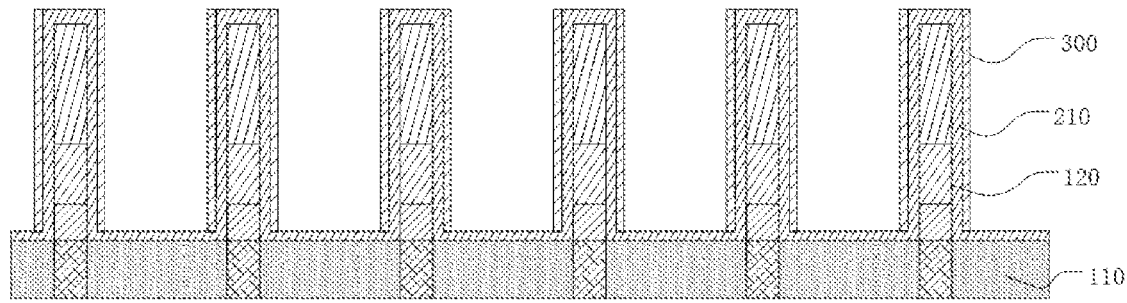
FIG. 16 is a schematic diagram of etching a shielding structure by using a first process in a method of forming a semiconductor structure according to an exemplary embodiment.
Figure 17:
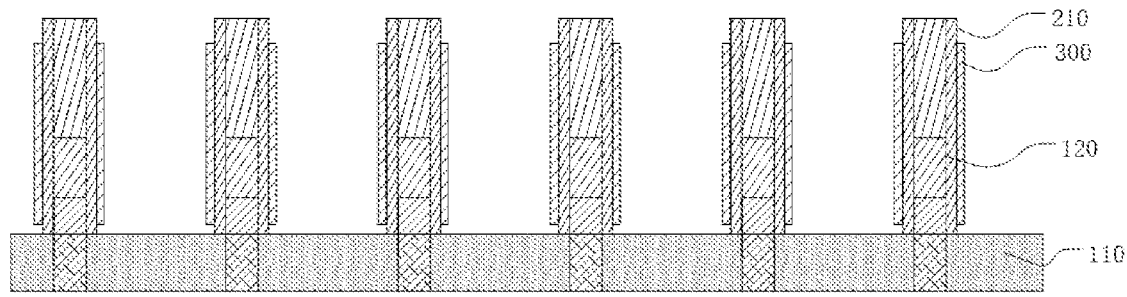
FIG. 17 is a schematic diagram of etching a shielding structure and an initial protective structure by using a first process to form protective structures in a method of forming a semiconductor structure according to an exemplary embodiment.
Figure 18:
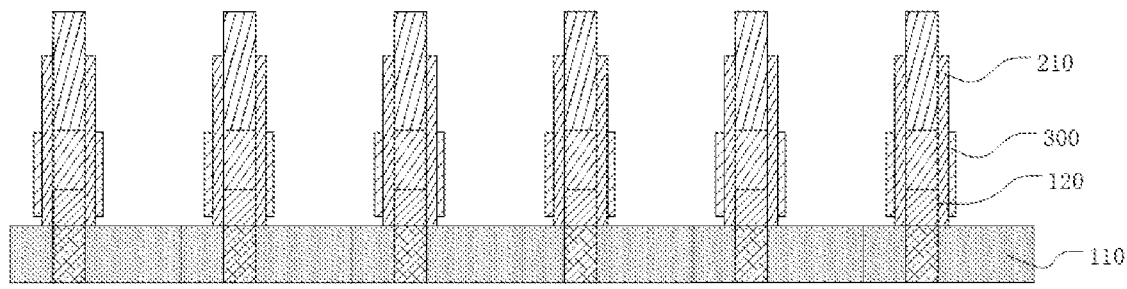
FIG. 18 is a schematic diagram of etching a shielding structure and an initial protective structure by using a first process to form protective structures in a method of forming a semiconductor structure according to an exemplary embodiment.

In this embodiment, the process of etching and removing the shielding structure 300 and a part of the initial protective structure 210 by using the first process includes: first, as shown in FIG. 16 with reference to FIG. 14, a part of the shielding structure 300 is etched and removed by using the first process, to expose the initial protective structure 210 covering the top surface of each of the bit line structures 120 and the initial protective structure 210 covering the top surface of the substrate 110. Then, as shown in FIG. 17 with reference to FIG. 18, the remaining shielding structure 300 and the exposed initial protective structure 210 are continuously etched using the first process. The etching speed of the first process in the vertical direction is greater than the etching speed of the first process in the horizontal direction. Therefore, during etching and removal of the shielding structure 300 by using the first process, in the vertical direction, as shown in FIG. 18 and FIG. 12, the shielding structure 300 covering the sidewalls of the initial protective structure 210 is gradually removed through etching from top to bottom, and the sidewalls of the initial protective structure 210 are gradually exposed from top to bottom. The exposed initial protective structure 210 is continuously etched using the first process, to remove the initial protective structure 210 covering the top surface of each of the bit line structures 120, the initial protective structure 210 covering the top surface of the substrate 110, and a part of the initial protective structure 210 covering the sidewalls at the top of each of the bit line structures 120.

In this embodiment, after the shielding structure and a part of the initial protective structure are removed by adjusting the etching time of the first process and the etching selectivity of the first material and the etching selectivity the second material to expose the top surface of the substrate, the retained initial protective structure covers the sidewalls of each of the bit line structures, and the initial protective structure has the second height, thus defining the sidewall contour of each of the bit line structures.

According to an exemplary embodiment, this embodiment describes step S110 of providing the initial structure in the foregoing embodiment.

The step of providing the initial structure is as follows:

S111: Provide a substrate, where the substrate includes active regions.

As shown in FIG. 7, the substrate 110 may be made of a silicon-containing semiconductor material. The semiconductor material may be one or more the following: silicon, germanium, silicon-germanium, and silicon-carbon. A plurality of active regions 111 are distributed in the substrate 110.

S112: Form bit line structures on the substrate.

As shown in FIG. 7, forming the bit line structure 120 on the substrate 110 includes: forming a contact portion 121 on the substrate 110, where the bottom of the contact portion 121 is in contact with the active regions 111, and a material of the contact portion 121 includes polysilicon; forming a conductive portion 122, where the conductive portion 122 covers a top surface of the contact portion 121, a material of the conductive portion 122 includes one or two or more of conductive metal, conductive metal nitride, and conductive alloy, for example, the conductive metal may be titanium, tantalum, or tungsten; forming an isolation portion 123, where the isolation portion 123 covers the top surface of the conductive portion 122, and a material of the isolation portion 123 may be silicon nitride, silicon oxynitride, or other materials with good insulation performance, and the isolation portion 123 covers the conductive portion 122, to protect the conductive portion 122.

According to some embodiments of the present disclosure, one of the formed protective structures at least covers sidewalls of the contact portion and sidewalls of the conductive portion.

Figure 13:
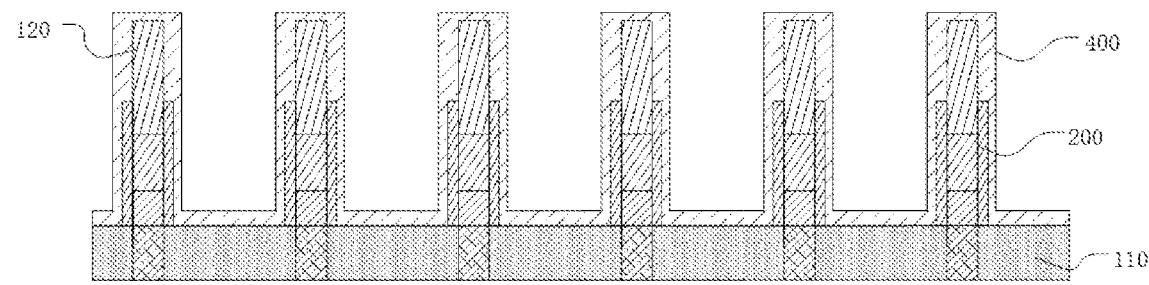
FIG. 13 is a schematic diagram of forming an initial protective structure in a method of forming a semiconductor structure according to an exemplary embodiment.

As shown in FIG. 12 and FIG. 13, the protective structures 200 each have a second height in the direction parallel to the bit line structures 120, where the second height is greater than a total height of the contact portion 121 and the conductive portion 122 of each of the bit line structures 120. One of the protective structures 200 covers the sidewalls of the contact portion 121 and the sidewalls of the conductive portion 122, to avoid penetration of the conductive metal in the conductive portion 122, thus protecting the bit line structures 120.

According to an exemplary embodiment, the method of forming a semiconductor structure provided by this embodiment includes the following steps:

Step S510: Provide an initial structure, where the initial structure includes a substrate and bit line structures arranged at intervals on the substrate.

Step S520: Form an initial protective structure, where the initial protective structure at least covers a part of sidewalls of each of the bit line structures, and the initial protective structure has a first height in a direction parallel to the bit line structures.

Step S530: Form a shielding structure, where the shielding structure at least covers a part of sidewalls of the initial protective structure.

Step S540: Remove at least a part of the initial protective structure exposed by the shielding structure by using the shielding structure as an etching selection layer, to form protective structures each having a second height.

Step S550: Form an insulation structure, where the insulation structure covers a top surface of each of the bit line structures, exposed sidewalls of each of the bit line structures, and the protective structures.

Steps S510 to S540 in this embodiment are implemented in the same manner as steps S110 to S140 of the foregoing embodiment, and will not be described in detail again herein.

In step S550 of this embodiment, as shown in FIG. 13 with reference to FIG. 12, the insulation structure 400 may be formed by depositing an insulation material through atomic layer deposition (ALD). The insulation structure 400 covers the op surface of each of the bit line structures 120, the exposed sidewalls of each of the bit line structures 120, and the protective structures 200.

An exemplary embodiment of the present disclosure provides a semiconductor structure; as shown in FIG. 12 and FIG. 13, the semiconductor structure includes: an initial structure 100 and protective structures 200, where the initial structure 100 includes a substrate 110 and bit line structures 120 arranged at intervals on the substrate 110, each of the protective structures 200 covers a part of sidewalls of each of the bit line structures 120, and the protective structures 200 each have a second height in a direction parallel to the bit line structures 120.

In the semiconductor structure of this embodiment, the contour of the sidewalls of each of the bit line structures is precise and complete, and the product yield and reliability are high.

According to an exemplary embodiment, the semiconductor structure of this embodiment is generally the same as that in the foregoing embodiment. The difference between this embodiment and the foregoing embodiment lies in that, as shown in FIG. 12 and FIG. 13, the substrate 110 includes active regions 111, each of the bit line structures 120 includes a contact portion 121, a conductive portion 122, and an isolation portion 123 that are sequentially stacked on the substrate 110, the contact portion 121 is in contact with the active region 111 of the substrate 110, and each of the protective structures 200 at least covers sidewalls of the contact portion 121 and sidewalls of the conductive portion 122.

According to an exemplary embodiment, the semiconductor structure of this embodiment is generally the same as that in the foregoing embodiment. The difference between this embodiment and the foregoing embodiment lies in that, as shown in FIG. 13, the semiconductor structure further includes an insulation structure 400, where the insulation structure 400 covers a top surface of each of the bit line structures 120, exposed sidewalls of each of the bit line structures 120, and the protective structures 200.

In the semiconductor structure of this embodiment, the protective structures cover the sidewalls of the bit line structures up to the second height. The sidewall contour of each of the bit line structures is precise and complete. This provides a basis for the development and mass production of semiconductor structures with higher precision, and ensures the yield and reliability of semiconductor structures with fine precision.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

According to the method of forming a semiconductor structure and a semiconductor structure provided by the embodiments of the present disclosure, during the manufacture process of the semiconductor structure, a shielding structure is added. With the shielding structure as an etching selection layer, the sidewall contour of each of the bit line structures is defined by adjusting the etching selectivity for etching the initial protective structure and the shielding structure.

The invention claimed is:

1. A method of forming a semiconductor structure, wherein
the method comprises:
providing an initial structure, wherein the initial structure comprises a substrate and bit line structures arranged at intervals on the substrate;
forming an initial protective structure, wherein the initial protective structure is formed on a top surface of each of the bit line structures, sidewalls of each of the bit line structures and a surface of the substrate, the method further comprises:
removing the initial protective structure covering the surface of the substrate, and removing the initial protective structure on the top surface of each of the bit line structures, to retain the initial protective structure at least covers a part of sidewalls of each of the bit line structures, and the initial protective structure has a first height in a direction parallel to the bit line structures;
forming a shielding structure, wherein the shielding structure at least covers a part of sidewalls of the initial protective structure; and
removing at least a part of the initial protective structure exposed by the shielding structure by using the shielding structure as an etching selection layer, to form protective structures each having a second height.

2. The method of forming a semiconductor structure according to claim 1, wherein
the forming the shielding structure comprises:
depositing a third material to partially fill a trench between adjacent bit line structures, to form the shielding structure, wherein the shielding structure has the second height in the direction parallel to the bit line structures.

3. The method of forming a semiconductor structure according to claim 2, wherein
the removing at least a part of the initial protective structure exposed by the shielding structure by using the shielding structure as an etching selection layer comprises:
removing the initial protective structure exposed by the shielding structure, to expose sidewalls of each of the bit line structures above the second height.

4. The method of forming a semiconductor structure according to claim 3, wherein
the method of forming a semiconductor structure further comprises:
removing the shielding structure, to expose the protective structures and a top surface of the substrate.

5. The method of forming a semiconductor structure according to claim 1, wherein
the forming the initial protective structure comprises:
depositing a first material to form the initial protective structure having a first thickness, and the initial protective structure has a first consistency.

6. The method of forming a semiconductor structure according to claim 5, wherein
the forming the shielding structure comprises:
depositing a second material to form the shielding structure having a second thickness, wherein the shielding structure covers the initial protective structure, and the shielding structure has a second consistency; and
the first thickness is greater than the second thickness, and the first consistency is greater than the second consistency.

7. The method of forming a semiconductor structure according to claim 6, wherein
the removing at least a part of the initial protective structure exposed by the shielding structure by using the shielding structure as an etching selection layer comprises:
etching and removing the shielding structure and a part of the initial protective structure by using a first process, wherein a retained initial protective structure has the second height in the direction parallel to the bit line structures.

8. The method of forming a semiconductor structure according to claim 7, wherein
an etching selectivity of the second material is greater than an etching selectivity of the first material, in the first process.

9. The method of forming a semiconductor structure according to claim 7, wherein
the first process is anisotropic etching, an extension direction of the bit line structures is taken as a vertical direction, an arrangement direction of the substrate is taken as a horizontal direction, and an etching speed of the first process in the vertical direction is greater than an etching speed of the first process in the horizontal direction.

10. The method of forming a semiconductor structure according to claim 1, wherein
the providing an initial structure comprises:
providing the substrate, wherein the substrate comprises active regions; and
forming the bit line structure on the substrate.

11. The method of forming a semiconductor structure according to claim 10, wherein
the forming the bit line structure on the substrate comprises:
forming a contact portion, wherein the contact portion is in contact with the active region;

forming a conductive portion, wherein the conductive portion covers a top surface of the contact portion; and forming an isolation portion, wherein the isolation portion covers a top surface of the conductive portion.

12. The method of forming a semiconductor structure according to claim 11, wherein
the protective structure at least covers sidewalls of the contact portion and sidewalls of the conductive portion.

13. The method of forming a semiconductor structure according to claim 1, wherein
the method of forming a semiconductor structure further comprises:
forming an insulation structure, wherein the insulation structure covers a top surface of each of the bit line structures, exposed sidewalls of each of the bit line structures, and the protective structures.

14. A method of forming a semiconductor structure, comprising:

providing an initial structure, wherein the initial structure comprises a substrate and bit line structures arranged at intervals on the substrate;

depositing a first material to form an initial protective structure having a first thickness, wherein the initial protective structure at least covers a part of sidewalls of each of the bit line structures, and the initial protective structure has a first consistency, the initial protective structure has a first height in a direction parallel to the bit line structures;

forming a shielding structure, wherein the shielding structure at least covers a part of sidewalls of the initial protective structure; and removing at least a part of the initial protective structure exposed by the shielding structure by using the shielding structure as an etching selection layer, to form protective structures each having a second height.

* * * * *